(12) United States Patent
Kim et al.

(10) Patent No.: US 11,127,805 B2
(45) Date of Patent: Sep. 21, 2021

(54) DISPLAY DEVICE

(71) Applicant: Samsung Display Co., Ltd., Yongin-si (KR)

(72) Inventors: Ji-Sun Kim, Seoul (KR); Jang Mi Kang, Seoul (KR); Sun Hwa Lee, Yongin-si (KR); Mu Kyung Jeon, Jung-gu (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 157 days.

(21) Appl. No.: 15/994,743

(22) Filed: May 31, 2018

(65) Prior Publication Data

US 2018/0350891 A1 Dec. 6, 2018

(30) Foreign Application Priority Data

Jun. 5, 2017 (KR) .................... 10-2017-0069782

(51) Int. Cl.
*H01L 27/32* (2006.01)
*H01L 29/786* (2006.01)
(Continued)

(52) U.S. Cl.
CPC ........... *H01L 27/3272* (2013.01); *G09G 3/00* (2013.01); *G09G 3/3233* (2013.01); *G09G 3/3258* (2013.01); *H01L 27/124* (2013.01); *H01L 27/1225* (2013.01); *H01L 27/1251* (2013.01); *H01L 27/1255* (2013.01); *H01L 27/3262* (2013.01); *H01L 27/3276* (2013.01); *H01L 29/7869* (2013.01); *H01L 29/78633* (2013.01); *H01L 29/78675* (2013.01); *G09G 2300/0465* (2013.01); *G09G 2300/0814* (2013.01); *G09G 2300/0819* (2013.01);
(Continued)

(58) Field of Classification Search
None
See application file for complete search history.

(56) References Cited

U.S. PATENT DOCUMENTS

2015/0155505 A1* 6/2015 Yamazaki ........... H01L 27/3258
257/40
2016/0307988 A1 10/2016 Kim et al.

FOREIGN PATENT DOCUMENTS

| KR | 1020150101404 | 9/2015 |
| KR | 1020150101411 | 9/2015 |
| KR | 1020160150199 | 12/2016 |

* cited by examiner

*Primary Examiner* — Aneeta Yodichkas
(74) *Attorney, Agent, or Firm* — Cantor Colburn LLP

(57) ABSTRACT

A display device includes a substrate, first and second transistors on the substrate, a first electrode connected to one of the first and second transistors, a second electrode facing the first electrode, and a light emission member between the first and second electrodes, where the first transistor includes a first channel including a polycrystalline semiconductor member on the substrate, a first source electrode and a first drain electrode at respective opposite sides of the first channel, a first gate electrode overlapping the first channel, and a first insulating layer covering the first gate electrode, the second transistor includes a second gate electrode on the first insulating layer, a second channel including an oxide semiconductor member on the second gate electrode, second source and drain electrodes on the second channel, and an external light blocking member on the second source and drain electrodes and overlapping the second channel.

21 Claims, 12 Drawing Sheets

(51) Int. Cl.
*H01L 27/12* (2006.01)
*G09G 3/3258* (2016.01)
*G09G 3/3233* (2016.01)
*G09G 3/00* (2006.01)

(52) U.S. Cl.
CPC ............ *G09G 2310/0251* (2013.01); *G09G 2320/0247* (2013.01); *G09G 2330/021* (2013.01)

DISPLAY DEVICE

This application claims priority to Korean Patent Application No. 10-2017-0069782, filed on Jun. 5, 2017, and all the benefits accruing therefrom under 35 U.S.C. § 119, the content of which in its entirety is herein incorporated by reference.

BACKGROUND

1. Field

Exemplary embodiments of the invention relate to a display device.

2. Description of the Related Art

In general, as a display device, one such as a liquid crystal display ("LCD") device, an organic light emitting device (also referred to as organic light emitting diode ("OLED") display device), and the like are used.

Particularly, the OLED display device includes two electrodes and an organic light emitting layer positioned therebetween. Electrons injected from a cathode that is an electrode and holes injected from an anode that is another electrode are bonded to each other in the organic light emitting layer to form excitons. Light is emitted while the excitons discharge energy.

The OLED display device includes a plurality of pixels including an OLED including the cathode, the anode, and the organic light emitting layer. A plurality of thin film transistors ("TFTs") and capacitors for driving the OLED are provided in each pixel.

The TFT includes a gate electrode, a source electrode, a drain electrode, and a semiconductor. The semiconductor is an important factor in determining characteristics of the TFT. The semiconductor mainly includes silicon (Si). The silicon is divided into amorphous silicon and polysilicon according to a crystallization type, where the amorphous silicon has a simple manufacturing process but has low charge mobility such that there is a limit for manufacturing a high performance TFT, and the polysilicon has high charge mobility but a process of crystallizing the silicon is desired such that the manufacturing cost is increased and the process is complicated. Recently, studies on a TFT using an oxide semiconductor with a higher on/off ratio and carrier mobility than the amorphous silicon, and lower cost and higher uniformity than polycrystalline silicon, have progressed.

SUMMARY

In general, a transistor including an oxide semiconductor has a bottom gate structure. However, because the oxide semiconductor is exposed outside in the bottom gate structure, a leakage current is easily generated due to external light.

An exemplary embodiment relates to a display device in which the leakage current is minimized.

A display device according to an exemplary embodiment includes a substrate a first transistor and a second transistor positioned on the substrate and separated from each other, a first electrode connected to one of the first transistor and the second transistor, a second electrode facing the first electrode, and a light emission member positioned between the first electrode and the second electrode, where the first transistor includes a first channel positioned on the substrate and including a polycrystalline semiconductor member, a first source electrode and a first drain electrode positioned at respective sides of the first channel, a first gate electrode overlapping the first channel, and a first insulating layer covering the first gate electrode, while the second transistor includes a second gate electrode positioned on the first insulating layer, a second channel positioned on the second gate electrode and including an oxide semiconductor member, a second source electrode and a second drain electrode positioned on the second channel, and an external light blocking member positioned on the second source electrode and the second drain electrode and overlapping the second channel.

In an exemplary embodiment, a driving voltage line which transmits a driving voltage to the light emission member may be further included, where the driving voltage line may include a first driving voltage line extending in a first direction and a second driving voltage line extending in a second direction crossing the first direction, and the external light blocking member may be positioned in the same layer as the first driving voltage line.

In an exemplary embodiment, the external light blocking member may be connected to the first driving voltage line.

In an exemplary embodiment, a second insulating layer between the second source electrode and the second drain electrode, and the external light blocking member, may be further included, and the second insulating layer may include an organic material.

In an exemplary embodiment, a first scan line which is positioned on the substrate and transmits a first scan signal, a second scan line which is positioned on the substrate and transmits a second scan signal that is inverse to the first scan signal, and a data line which crosses the first scan line and the second scan line and transmits a data voltage may be further, the first transistor may include a switching transistor connected to the first scan line and the data line, and a driving transistor connected to the switching transistor, the second transistor may include a compensation transistor turned on by the second scan signal to compensate a threshold voltage of the driving transistor, the compensation transistor may include a first oxide semiconductor member overlapping the second scan line, the second channel may include a compensation channel positioned in the first oxide semiconductor member, and the compensation channel may overlap the external light blocking member in a plan view.

In an exemplary embodiment, a third scan line which extends parallel to the first scan line and transmits a third scan signal, and an initialization voltage line which transmits an initialization voltage initializing the driving transistor, may be further included, the second transistor may further include an initialization transistor turned on depending on the third scan signal to transmit the initialization voltage to a driving gate electrode of the driving transistor, the initialization transistor may include a second oxide semiconductor member overlapping the third scan line, the second channel may further include an initialization channel positioned in the second oxide semiconductor member, and the initialization channel may overlap the external light blocking member.

In an exemplary embodiment, a bypass control line which transmits a bypass control signal may be further included, the second transistor may further include a bypass transistor that is turned on depending on the bypass control signal to bypass a part of a driving current transmitted by the driving transistor, the bypass transistor may include a third oxide semiconductor member overlapping the bypass control line, the second channel may further include a bypass channel positioned in the third oxide semiconductor member, and the bypass channel may overlap the external light blocking member.

In an exemplary embodiment, the data line and the first driving voltage line may be positioned in different layers from each other.

In an exemplary embodiment, the first scan line and the initialization voltage line may be positioned in the same layer as each other, and the second scan line, the third scan line, and the bypass control line may be positioned in the same layer as each other.

In an exemplary embodiment, the compensation channel, the initialization channel, and the bypass channel may be positioned to be separated from each other.

In an exemplary embodiment, the second gate electrode may include a compensation gate electrode that is a part of the second scan line and overlaps the compensation channel, an initialization gate electrode that is a part of the initialization voltage line and overlaps the initialization channel, and a bypass gate electrode that is a part of the bypass control line and overlaps the bypass channel.

In an exemplary embodiment, the second source electrode may include a compensation source electrode positioned in the same layer as the data line and partially overlapping the first oxide semiconductor member, an initialization source electrode positioned in the same layer as the data line and partially overlapping the second oxide semiconductor member, and a bypass source electrode positioned in the same layer as the data line and partially overlapping the third oxide semiconductor member.

In an exemplary embodiment, the second drain electrode may include a compensation drain electrode positioned in the same layer as the data line and partially overlapping the first oxide semiconductor member, an initialization drain electrode positioned in the same layer as the data line and partially overlapping the second oxide semiconductor member, and a bypass drain electrode positioned in the same layer as the data line and partially overlapping the third oxide semiconductor member.

In an exemplary embodiment, a driving gate electrode overlapping the second driving voltage line, and a first connecting member positioned in the same layer as the data line and connected to the driving gate electrode, may be further included, and the first connecting member may include the compensation drain electrode and the initialization source electrode.

In an exemplary embodiment, a second connecting member positioned in the same layer as the data line and connected to a part of the first channel may be further included, and the second connecting member may include the compensation source electrode.

In an exemplary embodiment, a third connecting member positioned in the same layer as the data line and connected to the initialization voltage line may be further included, and the third connecting member may include the initialization source electrode and the bypass drain electrode.

In an exemplary embodiment, a fourth connecting member positioned in the same layer as the data line and connected to a part of the first channel may be further included, and the fourth connecting member may include the bypass source electrode.

In an exemplary embodiment, a fifth connecting member positioned in the same layer as the data line and connected to the second driving voltage line may be further included.

In an exemplary embodiment, a sixth connecting member positioned in the same layer as the first driving voltage line and connected to the fourth connecting member may be further included.

In an exemplary embodiment, the external light blocking member may include a first boundary line and a second boundary line, and a plane first interval of the first boundary line and the second channel in a width direction may be larger than a plane second interval of the second boundary line and the second channel in a length direction.

Also, a display device according to an exemplary embodiment may include a substrate, a first scan line which is positioned on the substrate and transmits a first scan signal, a data line crossing the first scan line and transmits a data voltage, a first transistor including a polycrystalline semiconductor member and a second transistor including an oxide semiconductor member, where the first and second transistors are positioned on the substrate and separated from each other, a first electrode connected to one of the first transistor and the second transistor, a second electrode facing the first electrode, a light emission member positioned between the first electrode and the second electrode, and a driving voltage line transmits a driving voltage to the light emission member, where the driving voltage line is positioned on a different layer from the data line, and an external light blocking member extending from the driving voltage line overlaps the oxide semiconductor member and is positioned on the oxide semiconductor member.

According to exemplary embodiments, the leakage current due to the external light may be minimized without addition of a mask.

Also, reflectance may be minimized and the display device having high resolution may be manufactured.

BRIEF DESCRIPTION OF THE DRAWINGS

The above and other exemplary embodiments, advantages and features of this disclosure will become more apparent by describing in further detail exemplary embodiments thereof with reference to the accompanying drawings, in which.

DETAILED DESCRIPTION

Figure 1:
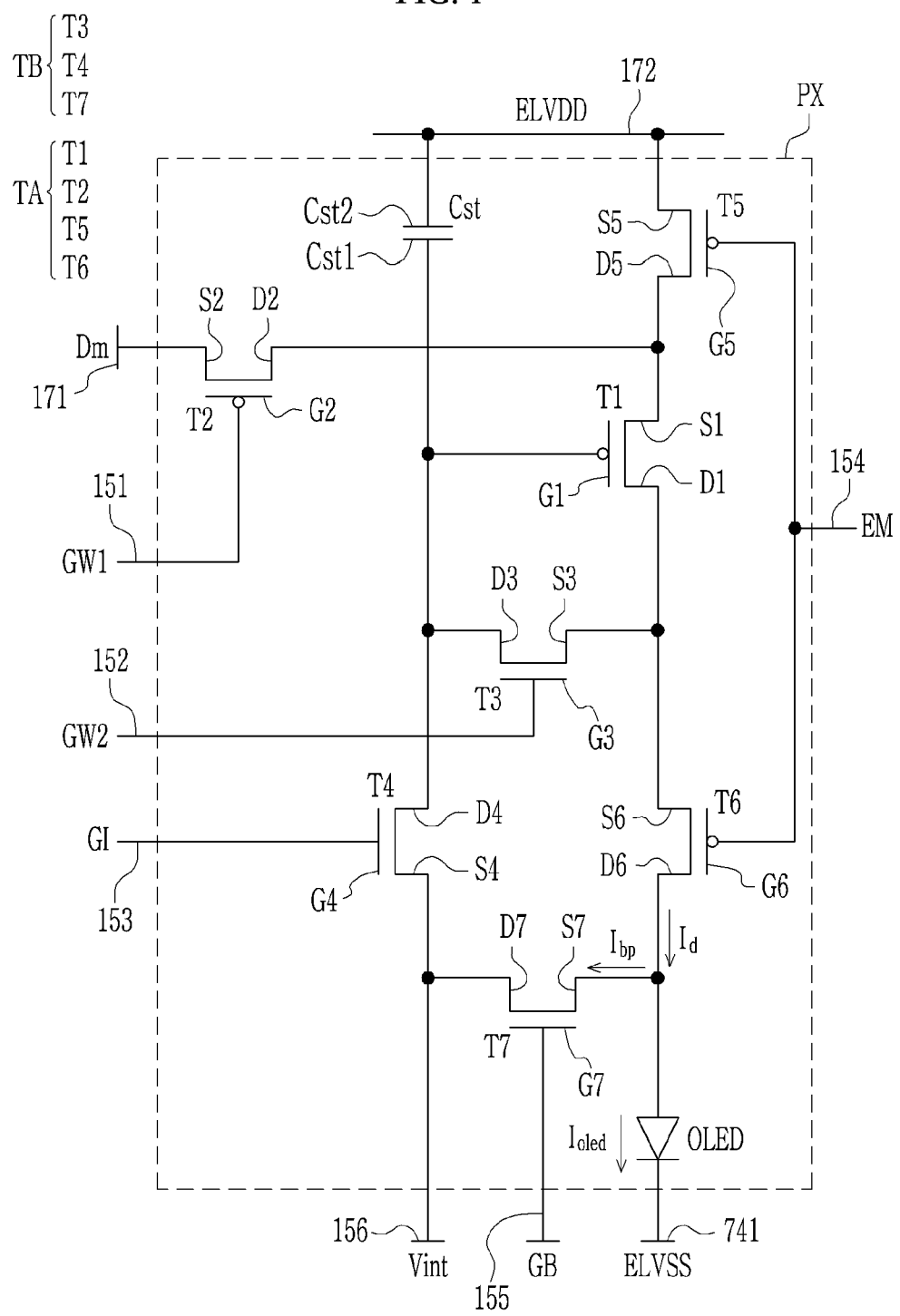
FIG. 1 is an equivalent circuit diagram of an exemplary embodiment of one pixel of a display device.

The invention will be described more fully hereinafter with reference to the accompanying drawings, in which exemplary embodiments of the invention are shown. As those skilled in the art would realize, the described embodiments may be modified in various different ways, all without departing from the spirit or scope of the invention.

In order to clearly explain the invention, portions that are not directly related to the invention are omitted, and the same reference numerals are attached to the same or similar constituent elements throughout the entire specification.

In addition, the size and thickness of each configuration shown in the drawings are arbitrarily shown for better understanding and ease of description, but the invention is not limited thereto. In the drawings, the thickness of layers, films, panels, regions, etc., are exaggerated for clarity. In the drawings, for better understanding and ease of description, the thicknesses of some layers and areas are exaggerated.

In addition, unless explicitly described to the contrary, the word "comprise" and variations such as "comprises" or "comprising" will be understood to imply the inclusion of stated elements but not the exclusion of any other elements. Throughout the specification, it will be understood that when an element such as a layer, film, region, or substrate is referred to as being "on" another element, it can be directly on the other element or intervening elements may also be present. Further, in the specification, the word "on" or "over" means positioning on or below the object portion, and does not essentially mean positioning on the upper side of the object portion based on a gravity direction.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an exemplary embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Further, the organic light emitting diode display OLED is not restricted to a number of transistors and capacitors shown in the accompanying drawings, it may include a plurality of transistors and at least one capacitor for each pixel, and it may have various kinds of configurations by providing an additional wire or omitting an existing wire. Here, the pixel represents a minimum unit for displaying an image, and the OLED display device displays images through a plurality of pixels.

Further, in the specification, the phrase "in a plan view" means when an object portion is viewed from the above, and the phrase "in a cross-section" means when a cross-section taken by vertically cutting an object portion is viewed from the side.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. In an exemplary embodiment, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the claims.

Now, a display device according to an exemplary embodiment will be described with reference to accompanying drawings.

FIG. 1 is an equivalent circuit diagram of one pixel of a display device according to an exemplary embodiment.

As shown in FIG. 1, one pixel PX of a display device according to an exemplary embodiment may include a plurality of transistors T1, T2, T3, T4, T5, T6, and T7, a storage capacitor Cst, and an organic light emitting diode ("OLED"), which are connected to a plurality of signal lines 151, 152, 153, 154, 155, 156, 171, and 172. In the illustrated exemplary embodiment, a structure including seven transistors and one capacitor is described, however the invention is not limited thereto, and a number of transistors and a number of capacitors may be variously changed.

The transistors T1, T2, T3, T4, T5, T6, and T7 may include a first transistor TA including a polycrystalline semiconductor and a second transistor TB including an oxide semiconductor. The first transistor TA may include a driving transistor T1, a switching transistor T2, an operation control transistor T5, and a light emission control transistor T6. The second transistor TB may include a compensation transistor T3, an initialization transistor T4, and a bypass transistor T7.

The signal lines 151, 152, 153, 154, 155, 156, 171, and 172 may include a plurality of first scan lines 151, a plurality of second scan lines 152, a plurality of third scan lines 153, a plurality of light emission control lines 154, a plurality of bypass control lines 155, a plurality of initialization voltage lines 156, a plurality of data lines 171, and a plurality of driving voltage lines 172. One first scan line 151, one second scan line 152, one third scan line 153, one light emission control line 154, one bypass control line 155, one initialization voltage line 156, one data line 171, and one driving voltage line 172 may be connected to one pixel PX.

The first scan line 151 may transmit a first scan signal GW1 to the switching transistor T2, the second scan line 152 may transmit a second scan signal GW2 to the compensation transistor T3, and the third scan line 153 may transmit a third scan signal GI to the initialization transistor T4. Also, the light emission control line 154 may transmit a light emission control signal EM to the operation control transistor T5 and the light emission control transistor T6, and the bypass control line 155 may transmit a bypass signal GB to the bypass transistor T7. In addition, the initialization voltage line 156 may transmit an initialization voltage Vint initializing the driving transistor T1.

The data line 171 may transmit a data signal Dm, and the driving voltage line 172 may transmit a driving voltage ELVDD.

A gate electrode G1 of the driving thin film transistor ("TFT") T1 is connected to one end Cst1 of the storage capacitor Cst, a source electrode S1 of the driving TFT T1 is connected with the driving voltage line 172 via the operation control TFT T5, and a drain electrode D1 of the driving TFT T1 is electrically connected with an anode of the OLED via the emission control TFT T6. The driving TFT T1 receives the data signal Dm according to a switching operation of the switching TFT T2 to supply a driving current Id to the OLED.

A gate electrode G2 of the switching TFT T2 is connected with the first scan line 151, a source electrode S2 of the switching TFT T2 is connected with the data line 171, and a drain electrode D2 of the switching TFT T2 is connected with the source electrode S1 of the driving TFT T1 and connected with the driving voltage line 172 via the operation control TFT T5. The switching TFT T2 is turned on according to the first scan signal GW1 received through the first scan line 151 to perform a switching operation transferring the data signal Dm transferred to the data line 171 to the source electrode of the driving TFT T1.

A gate electrode G3 of the compensation transistor T3 is connected to the second scan line 152, a source electrode S3 of the compensation transistor T3 is connected to the drain electrode D1 of the driving transistor T1 and connected to the anode of the OLED through the light emission control transistor T6, and a drain electrode D3 of the compensation transistor T3 is connected to a drain electrode D4 of the initialization transistor T4, one terminal Cst1 of the storage capacitor Cst, and the gate electrode G1 of the driving transistor T1 together. The compensation transistor T3 is turned on according to a second scan signal GW2 transmitted through the second scan line 152 to connect the gate electrode G1 and the drain electrode D1 of the driving transistor T1 to each other, thereby diode-connecting the driving transistor T1. As the second scan signal GW2 has an opposite level to the first scan signal GW1, when the first scan signal GW1 is a high level the second scan signal GW2 may be a low level, and when the first scan signal GW1 is the low level the second scan signal GW2 may be the high level.

A gate electrode G4 of the initialization transistor T4 is connected to the third scan line 153, a source electrode S4 of the initialization transistor T4 is connected to the initialization voltage line 156, and a drain electrode D4 of the initialization transistor T4 is connected to one terminal Cst1 of the storage capacitor Cst and the gate electrode G1 of the driving transistor T1 via the drain electrode D3 of the compensation transistor T3. The initialization transistor T4 is turned on depending on the third scan signal GI transferred through the third scan line 153 to transmit the initialization voltage Vint to the gate electrode GI of the driving transistor T1 so as to perform the initialization operation which initializes a gate voltage of the gate electrode GI of the driving transistor T1.

A gate electrode G5 of the operation control transistor T5 is connected to the light emission control line 154, a source electrode S5 of the operation control transistor T5 is connected to the driving voltage line 172, and a drain electrode D5 of the operation control transistor T5 is connected to the source electrode S1 of the driving transistor T1 and the drain electrode D2 of the switching transistor T2.

A gate electrode G6 of the light emission control transistor T6 is connected to the light emission control line 154, a source electrode S6 of the light emission control transistor T6 is connected to the drain electrode D1 of the driving transistor T1 and the source electrode S3 of the compensation transistor T3, and a drain electrode D6 of the light emission control transistor T6 is electrically connected to the anode of the OLED. The operation control transistor T5 and the light emission control transistor T6 are simultaneously turned on depending on the light emission control signal EM transmitted through the light emission control line 154 to compensate the driving voltage ELVDD through the diode-connected driving transistor T1 to be transmitted to the OLED.

A gate electrode G7 of the bypass transistor T7 is connected to the bypass control line 155, a source electrode S7 of the bypass transistor T7 is connected to the drain electrode D6 of the light emission control transistor T6 and the anode of the OLED, and a drain electrode D7 of the bypass transistor T7 is connected to the initialization voltage line 156 and the source electrode S4 of the initialization transistor T4.

The other terminal Cst2 of the storage capacitor Cst is connected with the driving voltage line 172, and a cathode of the OLED is connected with a common voltage line 741 transferring a common voltage ELVSS.

In this case, the first transistor TA including the driving transistor T1, the switching transistor T2, the operation control transistor T5, and the light emission control transistor T6 may be a transistor of a P-channel metal oxide semiconductor ("PMOS") structure, for example. Also, the second transistor TB including the compensation transistor T3, the initialization transistor T4, and the bypass transistor T7 may be a transistor of an N-channel metal oxide semiconductor ("NMOS") structure, for example.

Next, a detailed structure of the display device shown in FIG. 1 will be described with reference to FIG. 2 to FIG. 12.

Figure 2:
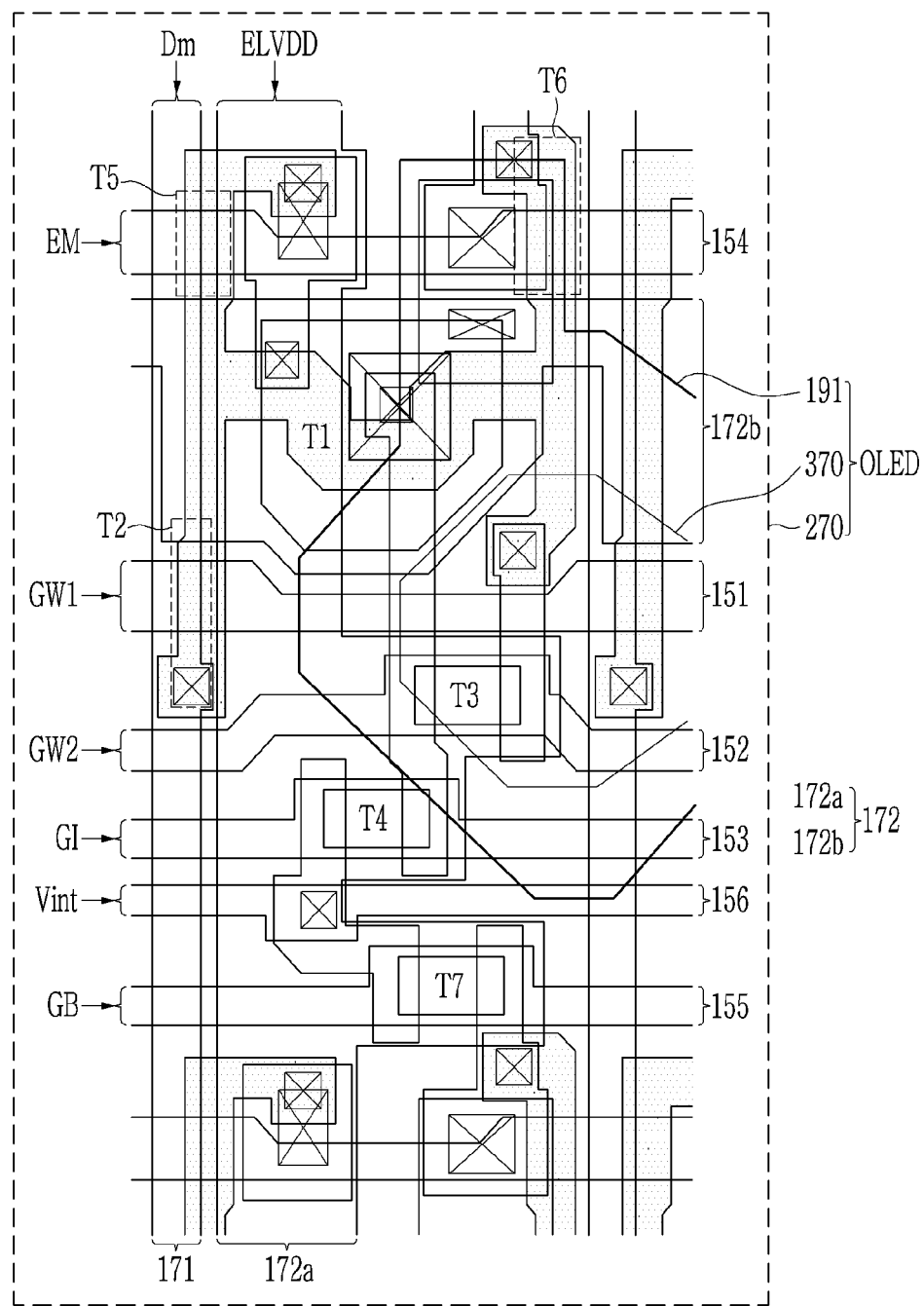
FIG. 2 is a schematic plan view of an exemplary embodiment of a plurality of transistors and capacitors of a display device.
Figure 3:
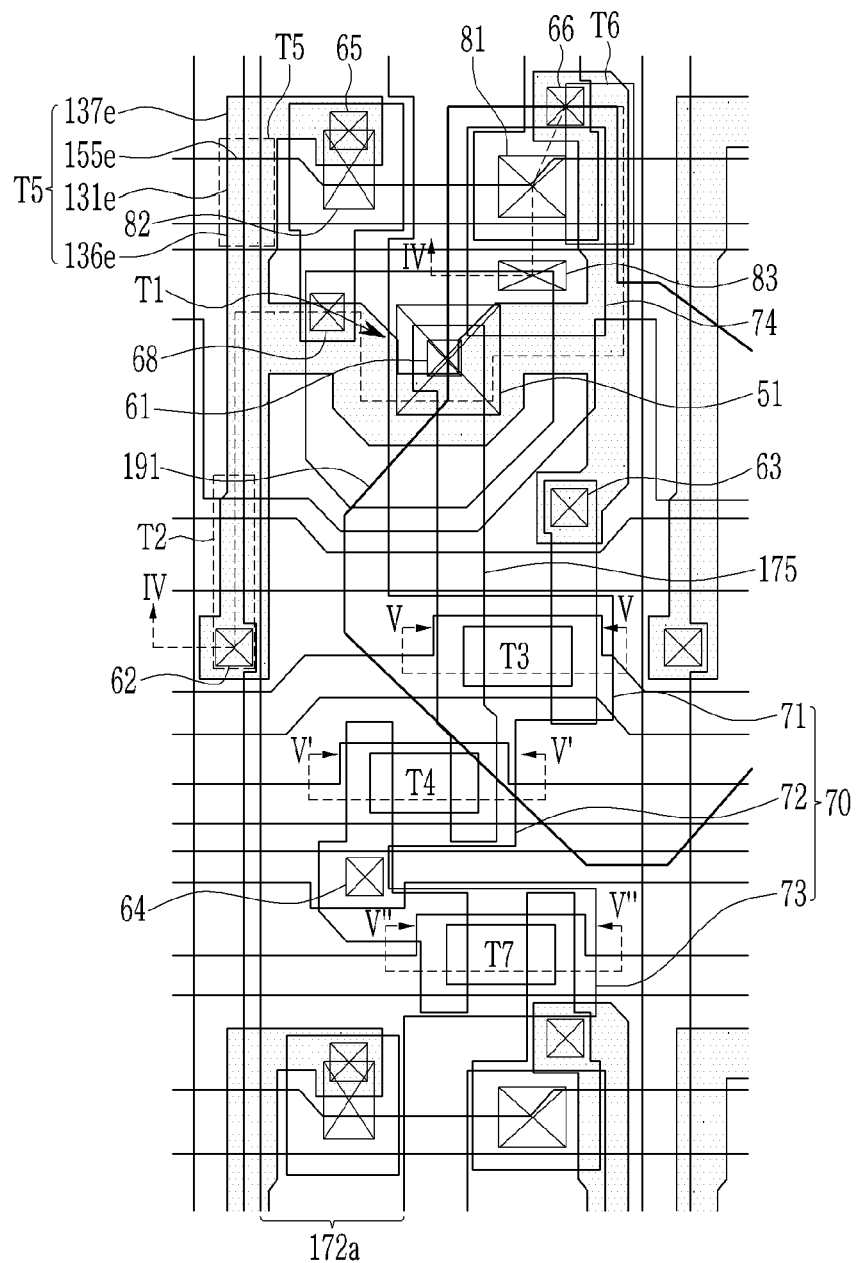
FIG. 3 is a detailed plan view of FIG. 2.
Figure 4:
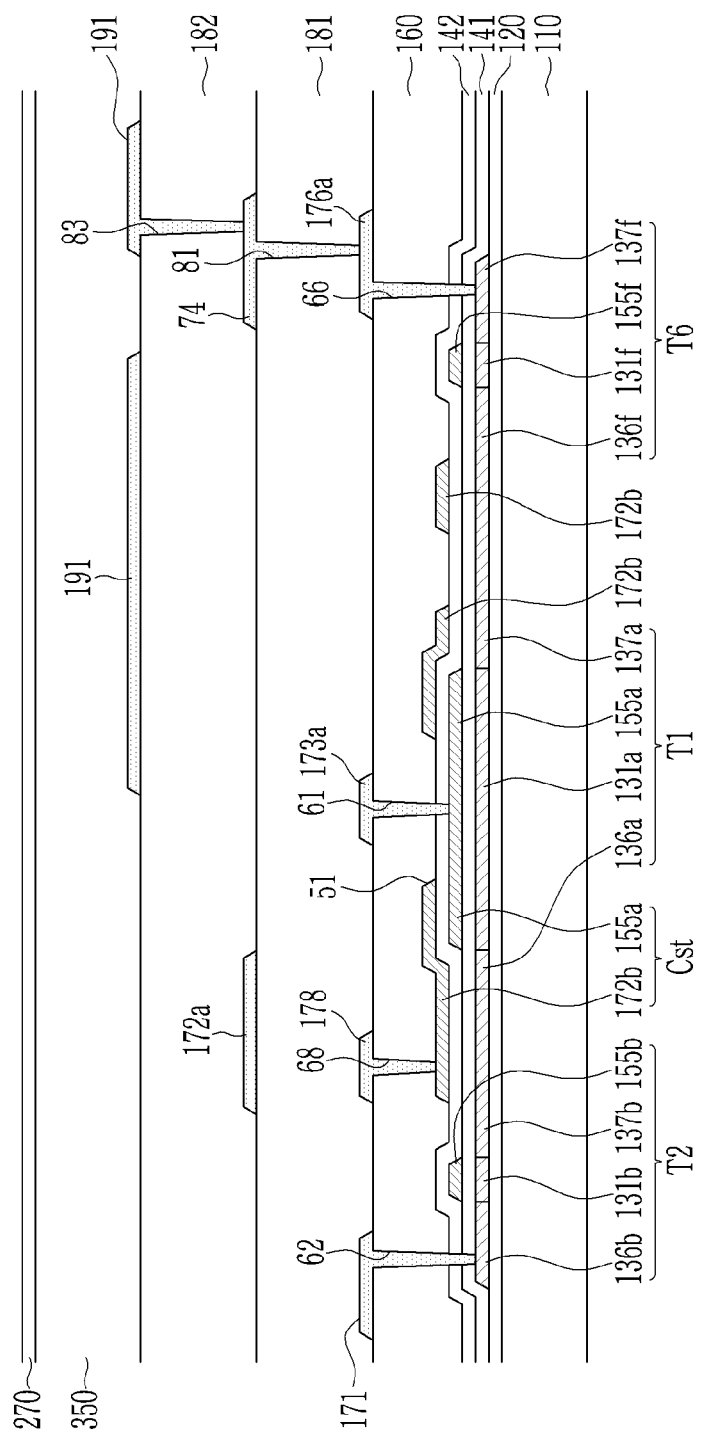
FIG. 4 is a cross-sectional view of a display device of FIG. 3 taken along line IV-IV.
Figure 5:
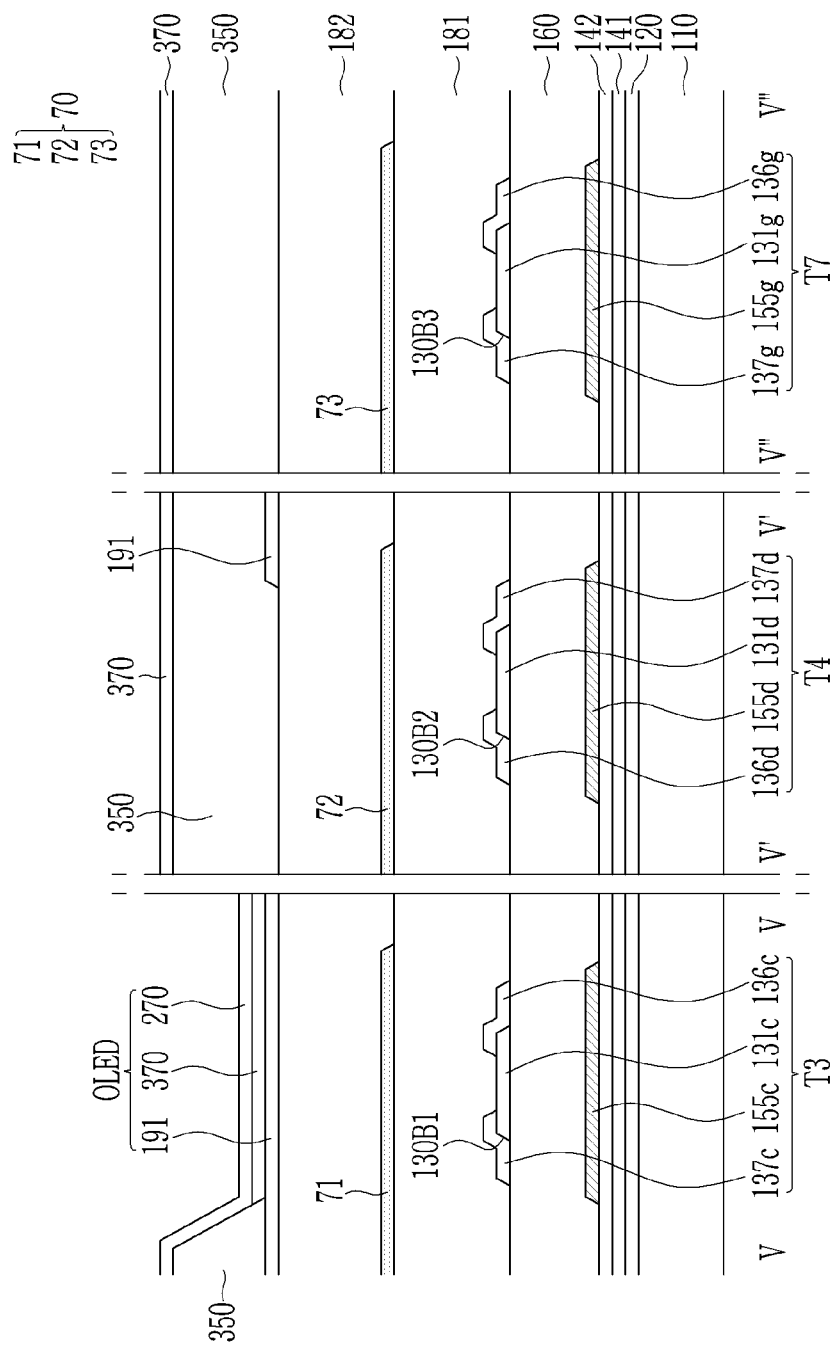
FIG. 5 is a cross-sectional view of a display device of FIG. 3 taken along lines V-V, V'-V', and V"-V".
Figure 6:
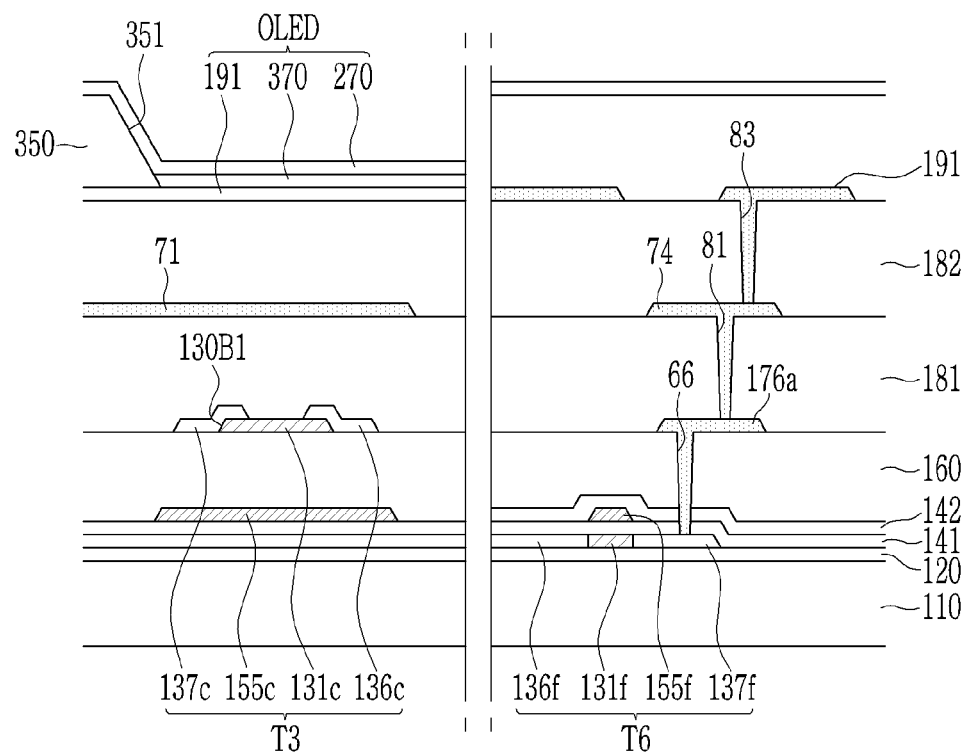
FIG. 6 is a cross-sectional view comparing a light emission control transistor of FIG. 4 and a compensation transistor of FIG. 5.

FIG. 2 is a schematic plan view of a plurality of transistors and capacitors of a display device according to an exemplary embodiment, and FIG. 3 is a detailed plan view of FIG. 2. FIG. 4 is a cross-sectional view of a display device of FIG. 3 taken along a line IV-IV, FIG. 5 is a cross-sectional view of a display device of FIG. 3 taken along lines V-V, V'-V', and V"-V", and FIG. 6 is a cross-sectional view comparing a light emission control transistor of FIG. 4 and a compensation transistor of FIG. 5.

Figure 7:
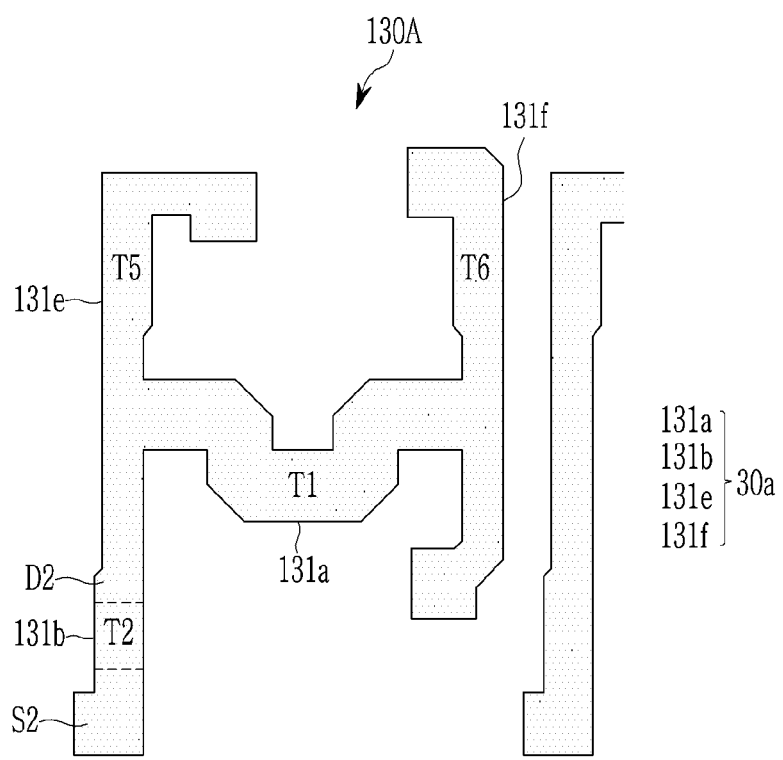
FIG. 7 is a plan view only showing a polycrystalline semiconductor member in FIG. 2.
Figure 8:
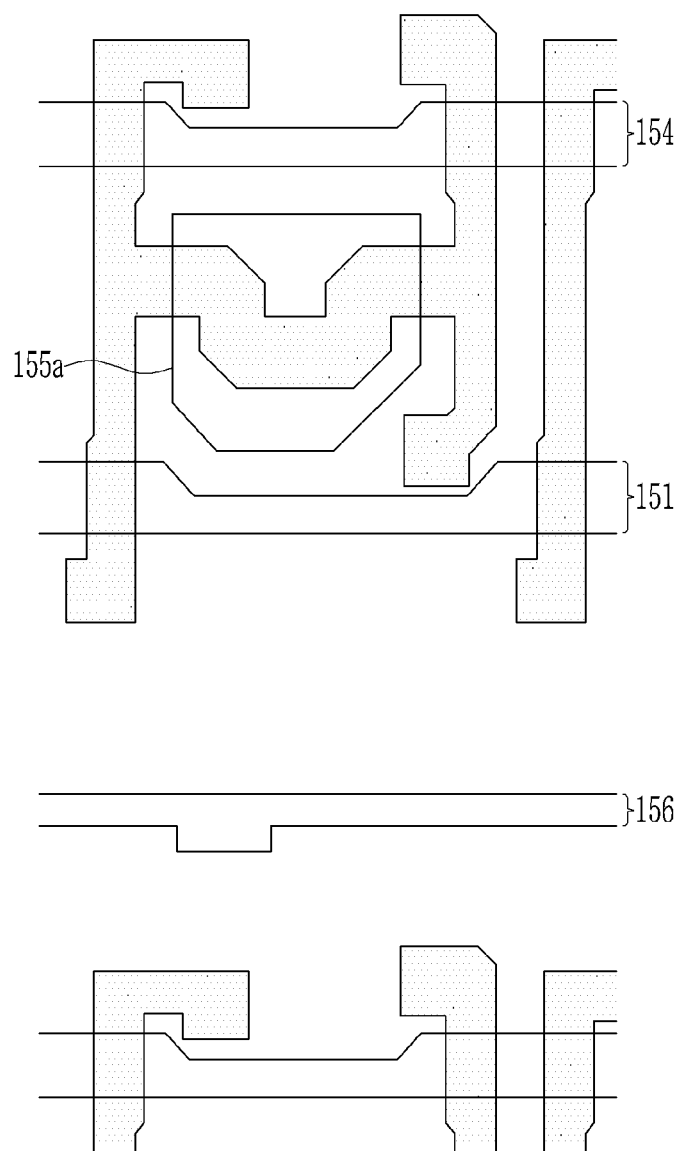
FIG. 8 is a plan view showing a state that a first gate metal line is deposited on a polycrystalline semiconductor member of FIG. 7.
Figure 9:
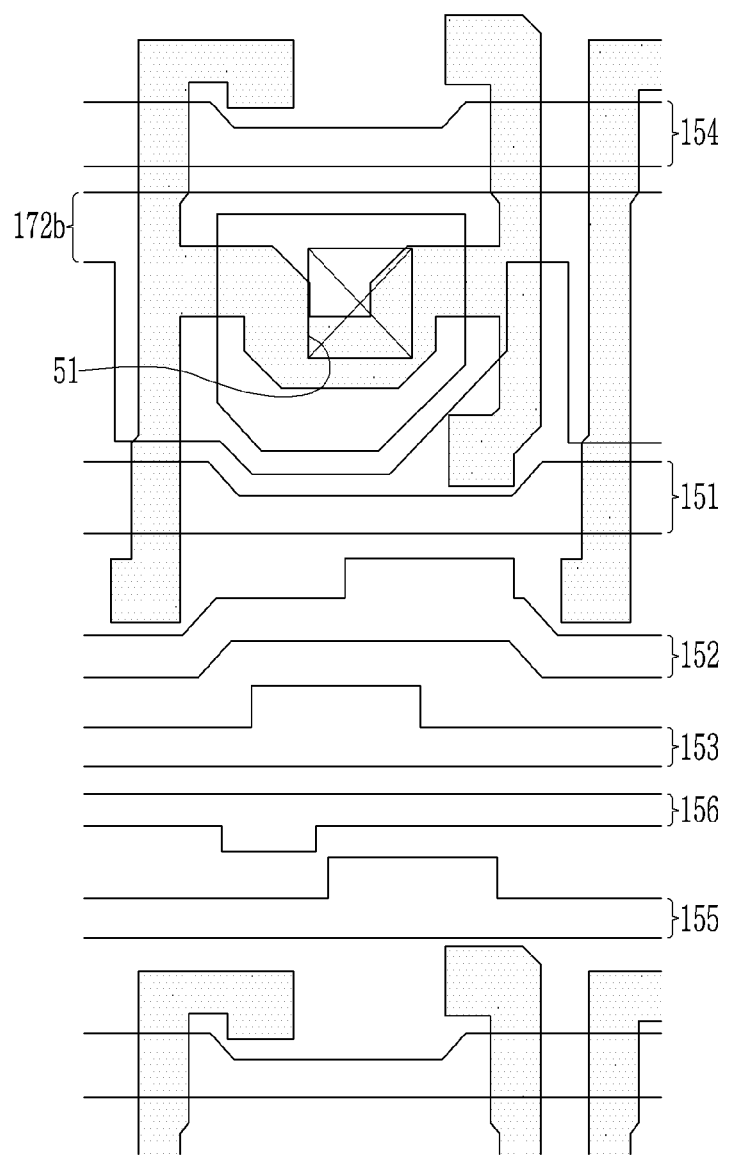
FIG. 9 is a plan view showing a state that a second gate metal line is deposited on a first gate metal line of FIG. 8.
Figure 10:
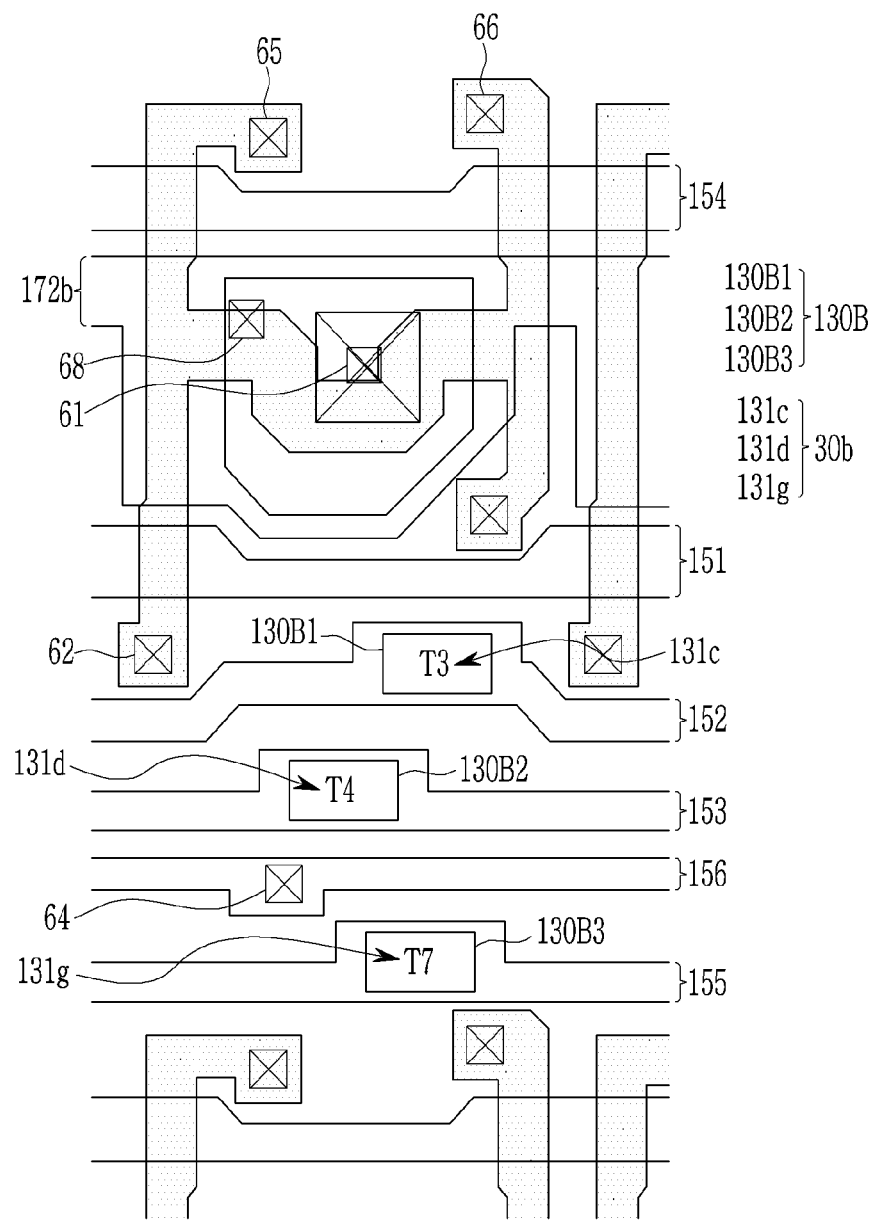
FIG. 10 is a plan view showing a state that an oxide semiconductor member is deposited on a second gate metal line of FIG. 9.
Figure 11:
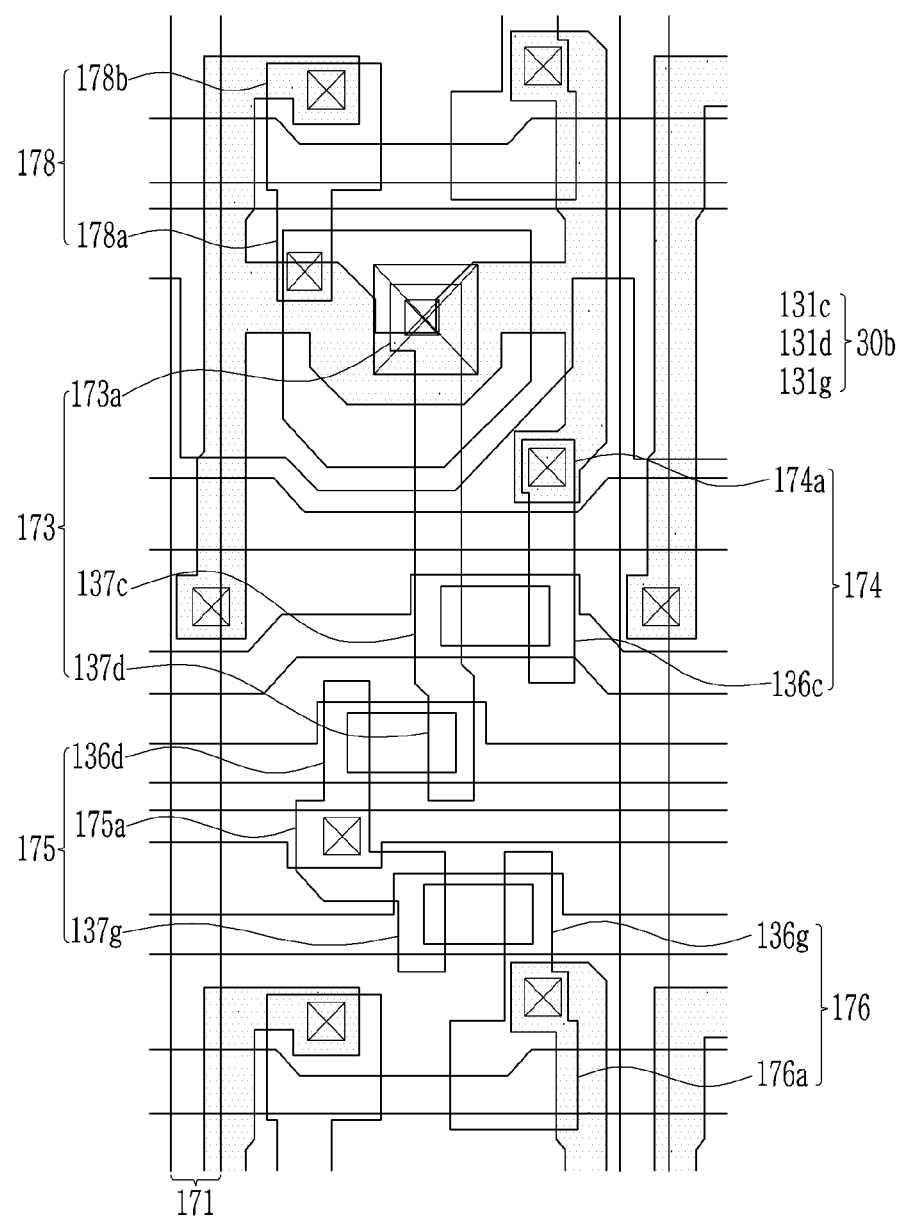
FIG. 11 is a plan view showing a state that a first data metal line is deposited on an oxide semiconductor member of FIG. 10.

FIG. 7 is a plan view only showing a polycrystalline semiconductor member in FIG. 2, and FIG. 8 is a plan view showing a state that a first gate metal line is deposited on a polycrystalline semiconductor member of FIG. 7. FIG. 9 is a plan view showing a state that a second gate metal line is deposited on a first gate metal line of FIG. 8, FIG. 10 is a plan view showing a state that an oxide semiconductor member is deposited on a second gate metal line of FIG. 9, and FIG. 11 is a plan view showing a state that a first data metal line is deposited on an oxide semiconductor member of FIG. 10.

A detailed plane structure and cross-sectional structure of the display device according to an exemplary embodiment will be described with reference to accompanying drawings.

First, as shown in FIGS. 2 and 3, the display device according to an exemplary embodiment includes the first scan line 151, the second scan line 152, the third scan line 153, the light emission control line 154, and the bypass control line 155 respectively applying the first scan signal GW1, the second scan signal GW2, the third scan signal GI, the light emission control signal EM, and the bypass signal GB and extending in a row direction. Also, the initialization voltage Vint is transmitted from the initialization voltage line 156 to the compensation transistor T3 via the initialization transistor T4.

In addition, the display device includes the data line 171 and the driving voltage line 172 respectively applying the data signal Dm and the driving voltage ELVDD to the pixel PX. The driving voltage line 172 may include a first driving voltage line 172a extending along the row direction as a first direction and parallel to the data line 171, and a second driving voltage line 172b extending in a column direction as a second direction and parallel to the first scan line 151. The first driving voltage line 172a and the second driving voltage line 172b may be connected to each other through a contact hole 68. Accordingly, compared with a case that the first driving voltage line 172a elongated in the column direction is only provided to transmit the driving voltage, the illustrated exemplary embodiment connects the first driving voltage line 172a elongated in the column direction and the second driving voltage line 172b elongated in the row direction through the contact hole 68 so as to form a mesh structure, thereby minimizing the voltage drop of the driving voltage line 172.

Also, the driving transistor T1, the switching transistor T2, the compensation transistor T3, the initialization transistor T4, the operation control transistor T5, the light emission control transistor T6, the bypass transistor T7, the storage capacitor Cst, and the OLED may be positioned in the pixel PX.

The OLED may include a pixel electrode 191, an organic emission layer 370, and a common electrode 270.

The driving transistor T1, the switching transistor T2, the operation control transistor T5, and the light emission control transistor T6 have a first channel 30a (refer to FIG. 7) to which a current flows when driving the turned-on transistor.

As shown in FIG. 7, the first channel 30a is provided inside one polycrystalline semiconductor member 130A, and the polycrystalline semiconductor member 130A may be curved in various shapes. The polycrystalline semiconductor member 130A may include a polycrystalline silicon.

The first channel 30a may include a driving channel 131a positioned in the driving transistor T1, a switching channel 131b positioned in the switching transistor T2, an operation control channel 131e positioned in the operation control transistor T5, and a light emission control channel 131f positioned in the light emission control transistor T6.

The polycrystalline semiconductor member 130A may include the first channel 30a which is channel-doped with an impurity, and a source doping region and a drain doping region which are provided at respective sides of the channel and doped at a higher concentration than the doping impurity doped on the channel. In the illustrated exemplary embodiment, the source doping region and the drain doping region provided in the polycrystalline semiconductor member may correspond to the source electrode and the drain electrode, respectively. In an exemplary embodiment, the source electrode S2 and the drain electrode D2 may be positioned at respective sides of the switching channel 131b, and the source electrode and the drain electrode may be also positioned at respective sides of other channels in the same manner, for example. The source electrode and the drain electrode provided in the polycrystalline semiconductor member 130A may be provided by doping only the corresponding regions. Further, in the polycrystalline semiconductor member 130A, a region between source electrodes and drain electrodes of different transistors is doped, and thus the source electrode and the drain electrode may be electrically connected to each other.

The driving transistor T1 includes the driving channel 131a, a driving gate electrode 155a (refer to FIGS. 4 and 8), a driving source electrode 136a (refer to FIG. 4), and a driving drain electrode 137a (refer to FIG. 4). In an exemplary embodiment, the driving channel 131a may be curved and may have a 'U' shape, for example. However, it is not limited thereto, and in other exemplary embodiment, the shape of the driving channel 131a may have various shapes such as a meandering shape, a zigzag shape, 'reverse S', 'S', 'M', 'W', etc, for example. As such, by forming the curved driving channel 131a, the driving channel 131a may be provided to be elongated in a narrow space. Accordingly, a driving range of the driving gate-source voltage between the driving gate electrode 155a and the driving source electrode 136a is increased by the elongated driving channel 131a. Since the driving range of the gate voltage is increased, a gray scale of light emitted from the OLED may be finely controlled by changing the magnitude of the gate voltage, and as a result, the resolution of the OLED display device may be enhanced and display quality may be improved.

The driving gate electrode 155a overlaps the driving channel 131a, and the driving source electrode 136a and the driving drain electrode 137a are disposed at respective opposite sides of the driving channel 131a to be adjacent. The driving gate electrode 155a is connected to one end part 173a (refer to FIGS. 4 and 11) of a first connecting member 173 (refer to FIG. 11) through a contact hole 61. The driving transistor T1 has a top gate structure of which the driving gate electrode 155a is positioned on the driving channel 131a.

The switching transistor T2 includes the switching channel 131b, a switching gate electrode 155b, a switching source electrode 136b, and a switching drain electrode 137b. The switching gate electrode 155b as a part of the first scan line 151 overlaps the switching channel 131b, and the switching source electrode 136b and the switching drain electrode 137b are disposed at respective opposite sides of the switching channel 131b to be close. The switching source electrode 136b is connected with the data line 171 through a contact hole 62. The switching transistor T2 has the top gate structure in which the switching gate electrode 155b is positioned on the switching channel 131b.

The operation control transistor T5 includes the operation control channel 131e, an operation control gate electrode 155e, an operation control source electrode 136e, and an operation control drain electrode 137e. The operation control gate electrode 155e which is a part of the light emission control line 154 overlaps with the operation control channel 131e, and the operation control source electrode 136e and the operation control drain electrode 137e are disposed at respective opposite sides of the operation control channel 131e to be close. The operation control source electrode 136e may be connected to the first driving voltage line 172a (refer to FIG. 2) through a contact hole 65 (refer to FIG. 3).

The operation control transistor T5 has the top gate structure in which the operation control gate electrode 155e is positioned on the operation control channel 131e.

The light emission control transistor T6 includes the light emission control channel 131f, a light emission control gate electrode 155f, a light emission control source electrode 136f, and a light emission control drain electrode 137f. The light emission control gate electrode 155f that is a part of the light emission control line 154 overlaps the light emission control channel 131f, and the light emission control source electrode 136f and the light emission control drain electrode 137f are provided to be adjacent to respective opposite sides of the light emission control channel 131f. The light emission control drain electrode 137f is connected to a fourth connecting member 176 through a contact hole 66.

One end of the driving channel 131a of the driving transistor T1 may be connected to the switching drain electrode 137b and the operation control drain electrode 137e, and the other end of the driving channel 131a may be connected to the light emission control source electrode 136f.

The light emission control transistor T6 has the top gate structure in which the light emission control gate electrode 155f is positioned on the light emission control channel 131f.

The driving gate electrode 155a, the switching gate electrode 155b, the operation control gate electrode 155e, and the light emission control gate electrode 155f form the first gate electrode. The driving source electrode 136a, the switching source electrode 136b, the operation control source electrode 136e, and the light emission control source electrode 136f form the first source electrode, and the driving drain electrode 137a, the switching drain electrode 137b, the operation control drain electrode 137e, and the light emission control drain electrode 137f form the first drain electrode.

It is difficult to drive the display device including the transistor including the polycrystalline semiconductor with a low frequency of less than about 30 Hertz (Hz) due to a flicker problem. Accordingly, since the display device including the transistor having the polycrystalline semiconductor must be driven with the high frequency to minimize the flicker, a power consumption increases.

Accordingly, in the illustrated exemplary embodiment, as the first transistor TA includes the polycrystalline semiconductor and the second transistor TB includes the oxide semiconductor capable of being driven at a low frequency, the flicker may be minimized and simultaneously the power consumption may be reduced.

The second transistor TB including the oxide semiconductor of the illustrated exemplary embodiment may have the bottom gate structure. The bottom gate structure may form the short channel compared with the top gate structure, and there is a merit of reducing a number of contact holes.

The compensation transistor T3, the initialization transistor T4, and the bypass transistor T7 as the second transistor TB of the bottom gate structure have a second channel 30b (refer to FIGS. 10 and 11) to which the current flows when driving the transistor.

Since an upper part of the second channel 30b including the oxide semiconductor is exposed, a leakage current is easily generated by external light. Accordingly, in the illustrated exemplary embodiment, an external light blocking member 70 is positioned at the position overlapping the second channel 30b, so the leakage current due to the external light may be minimized.

The second channel 30b may include a compensation channel 131c positioned inside a first oxide semiconductor member 130B1 (refer to FIG. 5), an initialization channel 131d positioned inside a second oxide semiconductor member 130B2 (refer to FIG. 5), and a bypass channel 131g positioned inside a third oxide semiconductor member 130B3 (refer to FIG. 5).

The external light blocking member 70 may include a first blocking member 71 extending from the first driving voltage line 172a and overlapping the compensation channel 131c, a second blocking member 72 overlapping the initialization channel 131d, and a third blocking member 73 overlapping the bypass channel 131g. The external light blocking member 70 will be described later.

As shown in FIG. 10, the second channel 30b is provided inside oxide semiconductor members 130B that are separated from each other, and each oxide semiconductor member 130B has a square shape, for example. However, the shape of the oxide semiconductor member 130B is not limited thereto, and variations of various shapes are possible. The oxide semiconductor member 130B may include the first oxide semiconductor member 130B1 positioned in the compensation transistor T3, the second oxide semiconductor member 130B2 positioned in the initialization transistor T4, and the third oxide semiconductor member 130B3 positioned in the bypass transistor T7.

The oxide semiconductor member 130B may include the oxide semiconductor. In an exemplary embodiment, the oxide semiconductor may include a metal oxide semiconductor, and may include oxides of metals such as zinc (Zn), indium (In), gallium (Ga), tin (Sn), and titanium (T1), or a combination of metals such as zinc (Zn), indium (In), gallium (Ga), tin (Sn), and titanium (T1), and oxides thereof, for example. In an exemplary embodiment, the oxide may include at least one among zinc oxide (ZnO), zinc-tin oxide ("ZTO"), zinc-indium oxide ("ZIO"), indium oxide (InO), titanium oxide (TiO), indium-gallium-zinc oxide ("IGZO"), and indium-zinc-tin oxide ("IZTO"), for example.

The compensation transistor T3 includes the compensation channel 131c, a compensation gate electrode 155c, a compensation source electrode 136c (refer to FIG. 11), and a compensation drain electrode 137c. The compensation transistor T3 has the bottom gate structure in which the compensation gate electrode 155c is positioned under the compensation channel 131c.

The compensation gate electrode 155c (refer to FIG. 5) that is a part of the second scan line 152 may overlap the first oxide semiconductor member 130B1. The compensation source electrode 136c corresponds to one end part of a second connecting member 174 (refer to FIG. 11), and the compensation drain electrode 137c (refer to FIG. 11) corresponds to a center part of the first connecting member 173 (refer to FIG. 11).

The compensation source electrode 136c and the compensation drain electrode 137c partially overlap the first oxide semiconductor member 130B1 in a plan view. Among the first oxide semiconductor member 130B1, a part that does not overlap the compensation source electrode 136c and the compensation drain electrode 137c may form the compensation channel 131c. Accordingly, because the compensation channel 131c is exposed outside, the leakage current is easily generated due to the external light. The first blocking member 71 overlapping the compensation channel 131c is positioned to extend from the first driving voltage line 172a. The first blocking member 71 may prevent the external light from being transmitted to the compensation channel 131c such that the leakage current caused by the external light may be minimized.

Another end part 174a (refer to FIG. 11) of the second connecting member 174 may be connected to the driving drain electrode 137a (refer to FIG. 4) through a contact hole 63 (refer to FIG. 3).

The initialization transistor T4 includes the initialization channel 131d, an initialization gate electrode 155d, an initialization source electrode 136d, and an initialization drain electrode 137d. The initialization transistor T4 has the bottom gate structure in which the initialization gate electrode 155d is positioned under the initialization channel 131d. The initialization gate electrode 155d that is a part of the third scan line 153 may overlap the initialization channel 131d. The initialization source electrode 136d corresponds to one end part of a third connecting member 175, and the initialization drain electrode 137d corresponds to the other end part of the first connecting member 173.

The initialization source electrode 136d and the initialization drain electrode 137d partially overlap the second oxide semiconductor member 130B2 in a plan view. Among the second oxide semiconductor member 130B2, a part that does not overlap the initialization source electrode 136d and the initialization drain electrode 137d may form the initialization channel 131d. Accordingly, because the initialization channel 131d is exposed outside, the leakage current is easily generated by the external light. The second blocking member 72 overlapping the initialization channel 131d is positioned to extend from the first driving voltage line 172a. The second blocking member 72 may prevent the external light from being transmitted to the initialization channel 131d such that the leakage current caused by the external light may be minimized.

The center part 175a of the third connecting member 175 may be connected to the initialization voltage line 156 through a contact hole 64.

The bypass transistor T7 includes the bypass channel 131g, a bypass gate electrode 155g, a bypass source electrode 136g, and a bypass drain electrode 137g. The bypass transistor T7 has the bottom gate structure in which the bypass gate electrode 155g is positioned under the bypass channel 131g.

The bypass gate electrode 155g that is a part of the bypass control line 155 may overlap the third oxide semiconductor member 130B3.

One end part of the fourth connecting member 176 (refer to FIG. 11) corresponds to the bypass source electrode 136g, and another end part 176a (refer to FIG. 11) of the fourth connecting member 176 may be connected to a sixth connecting member 74 (refer to FIGS. 3 and 4) through a contact hole 81 (refer to FIGS. 3 and 4). The sixth connecting member 74 may be connected to a pixel electrode 191 through a contact hole 83.

The bypass source electrode 136g and the bypass drain electrode 137g overlap a part of the third oxide semiconductor member 130B3 in a plan view. Among the third oxide semiconductor member 130B3, a part that does not overlap the bypass source electrode 136g and the bypass drain electrode 137g may form the bypass channel 131g. Accordingly, because the bypass channel 131g is exposed outside, the leakage current is easily generated by the external light. The third blocking member 73 overlapping the bypass channel 131g is positioned to extend from the first driving voltage line 172a. The third blocking member 73 may prevent the external light from being transmitted to the bypass channel 131g such that the leakage current caused by the external light may be minimized.

The bypass source electrode 136g (refer to FIG. 11) may be connected to the light emission control drain electrode 137f through the contact hole 66 (refer to FIG. 3), and the bypass drain electrode 137g may be connected directly to the initialization source electrode 136d (refer to FIG. 11).

Here, the compensation gate electrode 155c, the initialization gate electrode 155d, and the bypass gate electrode 155g form the second gate electrode. The compensation source electrode 136c, the initialization source electrode 136d, and the bypass source electrode 136g form the second source electrode, and the compensation drain electrode 137c, the initialization drain electrode 137d, and the bypass drain electrode 137g form the second drain electrode.

As shown in FIG. 9, the storage capacitor Cst includes the first storage electrode 155a (refer to FIGS. 4 and 8) and the second storage electrode 172b overlapping each other via a second gate insulating layer 142 (refer to FIGS. 4 to 6). The first storage electrode 155a corresponds to the driving gate electrode 155a, and the second storage electrode 172b as a part extending from the second driving voltage line 172b occupies a wider area than the driving gate electrode 155a, thereby entirely covering the driving gate electrode 155a.

Here, the second gate insulating layer 142 becomes a dielectric material, and a storage capacitance is determined by a charge charged in the storage capacitor Cst and the voltage between both storage electrodes 155a and 172b. As described above, as the driving gate electrode 155a is used as the first storage electrode 155a, a space for forming the storage capacitor may be obtained in the space that is narrowed by the driving channel 131a having a large area in the pixel.

The first storage electrode 155a as the driving gate electrode 155a may be connected to one end part of the first connecting member 173 through the contact hole 61 and a storage opening 51. The storage opening 51 is an opening defined in the second storage electrode 172b. Accordingly, the contact hole 61 connecting one end part 173a of the first connecting member 173 and the driving gate electrode 155a is defined inside the storage opening 51. The first connecting member 173 is disposed in the same layer as the data line 171 to be substantially parallel therewith, the center part of the first connecting member 173 corresponds to the compensation drain electrode 137c of the compensation transistor T3, and the other end part of the first connecting member corresponds to the initialization drain electrode 137d of the initialization transistor T4.

Accordingly, the first connecting member 173 connects the driving gate electrode 155a, the compensation drain electrode 137c of the compensation transistor T3, and the initialization drain electrode 137d of the initialization transistor T4.

The second storage electrode 172b may be connected to one end part 178a (refer to FIG. 11) of a fifth connecting member 178 (refer to FIG. 11) through the contact hole 68 (refer to FIG. 3). Another end part 178b of the fifth connecting member 178 may be connected to the first driving voltage line 172a (refer to FIGS. 2 and 3) through a contact hole 82 (refer to FIG. 3). Accordingly, the storage capacitor Cst stores the storage capacitance corresponding to a difference between the driving voltage ELVDD transmitted to the second storage electrode 172b through the first driving voltage line 172a and the driving gate voltage of the driving gate electrode 155a.

Hereinafter, the cross-sectional structures of the display device according to an exemplary embodiment of the invention will be described in detail according to a stacking order with reference to FIGS. 4 and 5.

A buffer layer 120 may be positioned on a substrate 110. In an exemplary embodiment, the substrate 110 may be provided as an insulating substrate including glass, quartz, ceramic, plastic, and the like, for example, and the buffer layer 120 may serve to improve a characteristic of polycrystalline silicon and reduce stress applied to the substrate 110 by blocking impurities from the substrate 110 during a crystallization process for forming polycrystalline silicon.

A polycrystalline semiconductor member 130A (refer to FIG. 7) in which a driving channel 131a, a switching channel 131b, an operation control channel 131e, and a light emission control channel 131f are disposed may be positioned on the buffer layer 120.

In the polycrystalline semiconductor member 130A, a driving source electrode 136a and a driving drain electrode 137a may be positioned at respective opposite sides of the driving channel 131a, and a switching source electrode 136b and a switching drain electrode 137b may be positioned at respective opposite sides of the switching channel 131b.

An operation control source electrode 136e and an operation control drain electrode 137e are positioned at respective opposite sides of the operation control channel 131e, and a light emission control source electrode 136f and a light emission control drain electrode 137f are positioned at respective opposite sides of the light emission control channel 131f.

A first gate insulating layer 141 covering the polycrystalline semiconductor member 130A may be positioned thereon. The first gate insulating layer 141 may be a first insulating layer.

As shown in FIG. 8, on the first gate insulating layer 141, a first gate metal line (151, 154, 156, and 155a) including a first scan line 151 including a switching gate electrode 155b (refer to FIG. 4), a light emission control line 154 including an operation control gate electrode 155e and a light emission control gate electrode 155f, and an initialization voltage line 156 may be positioned.

A second gate insulating layer 142 covering the first gate metal line (151, 154, 156, and 155a) and the first gate insulating layer 141 may be positioned thereon. In an exemplary embodiment, the first gate insulating layer 141 and the second gate insulating layer 142 may include a silicon nitride (SiNx) or a silicon oxide (SiOx), for example.

As shown in FIG. 9, a second gate metal line (172b, 152, 153, and 155) including a second driving voltage line 172b, a second scan line 152 including a compensation gate electrode 155c (refer to FIG. 5), a third scan line 153 including an initialization gate electrode 155d (refer to FIG. 5), and a bypass control line 155 including a bypass gate electrode 155g (refer to FIG. 5) may be positioned on the second gate insulating layer 142.

In an exemplary embodiment, a gate metal line (151, 154, 156, 155a, 172b, 152, 153, and 155) including the first gate metal line (151, 154, 156, and 155a) and the second gate metal line (172b, 152, 153, and 155) may be provided as a multilayer in which a metal layer including one among copper (Cu), a copper alloy, aluminum (Al), an aluminum alloy, molybdenum (Mo), and a molybdenum alloy is stacked, for example. However, the first gate metal line (151, 154, 156, and 155a) and the second gate metal line (172b, 152, 153, and 155) are not include the same material and may include different materials.

An interlayer insulating layer 160 (refer to FIGS. 4 to 6) may be positioned on the second gate insulating layer 142 and the second gate metal line (172b, 152, 153, and 155). In an exemplary embodiment, the interlayer insulating layer 160 may include a silicon nitride (SiNx) or a silicon oxide (SiOx), for example.

As shown in FIG. 10, contact holes 61, 62, 63, 64, 65, 66, and 68 may be defined in the interlayer insulating layer 160. An oxide semiconductor member 130B including a first oxide semiconductor member 130B1 in which a compensation channel 131c, an initialization channel 131d, and a bypass channel 131g are respectively provided, a second oxide semiconductor member 130B2, and a third oxide semiconductor member 130B3 may be positioned on the interlayer insulating layer 160.

As shown in FIG. 11, a first data metal line (171, 173, 174, 175, 176, and 178) including a data line 171, a first connecting member 173, a second connecting member 174, a third connecting member 175, a fourth connecting member 176, and a fifth connecting member 178 may be positioned on the oxide semiconductor member 130B (refer to FIG. 10) and the interlayer insulating layer 160 (refer to FIGS. 4 and 6). In an exemplary embodiment, the first data metal line (171, 173, 174, 175, 176, and 178) may be provided as a multilayer in which metal layers including any one of copper (Cu), a copper alloy, aluminum (Al), an aluminum alloy, molybdenum (Mo), and a molybdenum alloy are stacked, and for example, may be provided as a triple layer of titanium/aluminum/titanium (Ti/Al/Ti), a triple layer of molybdenum/aluminum/molybdenum (Mo/Al/Mo), or a triple layer of molybdenum/copper/molybdenum (Mo/Cu/Mo).

The data line 171 may be connected to the switching source electrode 136b through the contact hole 62 (refer to FIGS. 3 and 4) defined in the first gate insulating layer 141 (refer to FIGS. 4 to 6), the second gate insulating layer 142 (refer to FIGS. 4 to 6), and the interlayer insulating layer 160, and one end part 173a of the first connecting member 173 may be connected to the first storage electrode 155a (refer to FIGS. 4 and 8) through the contact hole 61 (refer to FIGS. 3 and 4) defined in the second gate insulating layer 142 and the interlayer insulating layer 160.

The other end part 176a of the fourth connecting member 176 may be connected to the light emission control drain electrode 137f (refer to FIG. 4) through the contact hole 66 (refer to FIGS. 3 and 4) defined in the first gate insulating layer 141, the second gate insulating layer 142, and the interlayer insulating layer 160.

A first passivation layer 181 (refer to FIGS. 4 to 6) covering the first data metal line (171, 173, 174, 175, 176, and 178), the second channel 30b, and the interlayer insulating layer 160 may be positioned thereon. In an exemplary embodiment, the first passivation layer 181 may include an organic material such as a polyacryl-based resin, a polyimide-based resin, or a deposition layer of the organic material and an inorganic material. The first passivation layer 181 may be a second insulating layer.

As shown in FIG. 3, contact holes 81 and 82 may be defined in the first passivation layer 181.

A second data metal line (172a, 70, and 74) including a first driving voltage line 172a, an external light blocking member 70 (refer to FIG. 3), and a sixth connecting member 74 (refer to FIG. 3) may be positioned on the first passivation layer 181.

As described above, the data line 171 and the first driving voltage line 172a are positioned on the different layers, thereby more pixels may be disposed in the same space such that a display device with high resolution may be manufactured.

The external light blocking member 70 may be positioned in the same layer as the first driving voltage line 172a, and may be connected to the first driving voltage line 172a. Accordingly, the same voltage as the driving voltage ELVDD (refer to FIG. 1) transmitted to the first driving voltage line 172a is applied to the external light blocking member 70.

Figure 12:
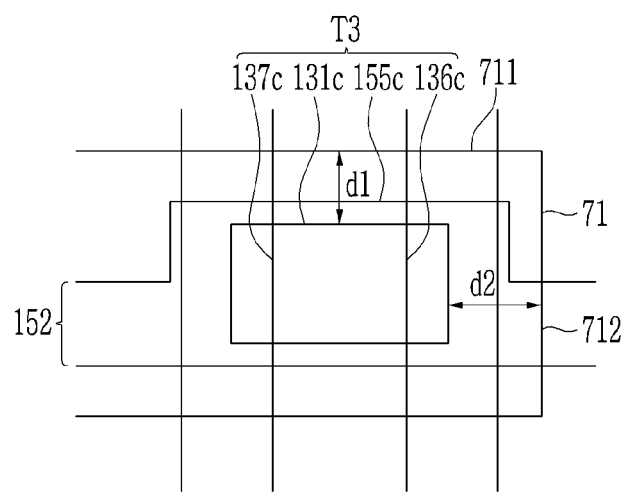
FIG. 12 is a partial enlarged view of a compensation transistor of FIGS. 2 and 3.

FIG. 12 is a partial enlarged view of a compensation transistor of FIG. 3.

As shown in FIG. 12, a first boundary line 711 of the first blocking member 71 and a plane first interval d1 of the compensation channel 131c in a width direction (e.g., vertical direction in FIG. 12) may be larger than a second boundary line 712 of the first blocking member 71 and a plane second interval d2 of the compensation channel 131c in a length direction (e.g., horizontal direction in FIG. 12). This is because both ends of the compensation channel 131c partially block the external light by the compensation source electrode 136c and the compensation drain electrode 137c such that the length direction of the compensation channel 131c is less exposed than the width direction. Accordingly, as the first interval d1 extending in the width direction of the compensation channel 131c increases more than the second interval d2 extending in the length direction of the compensation channel 131c, more external light may be blocked.

The first boundary line 711 of the external light blocking member 70 may be a boundary parallel to an extending direction of the first scan line 151, and the second boundary line 712 of the external light blocking member 70 may be a boundary parallel to an extending direction of the data line 171. In FIG. 12, only the first blocking member 71 overlapping the compensation transistor T3 is described, however it is not limited thereto, and the same description may be applied to the second blocking member 72 overlapping the initialization transistor T4 and the third blocking member 73 overlapping the bypass transistor T7.

When forming the external light blocking member 70 (refer to FIG. 3) in the same layer as the pixel electrode 191 (FIGS. 3 to 6), the area of the pixel electrode 191 must be reduced such that it is difficult to implement the display device with high resolution. Also, when forming the external light blocking member 70 in the same layer as the pixel electrode 191, reflectance increases by the external light blocking member 70.

In the illustrated exemplary embodiment, since the external light blocking member 70 is disposed in the same layer as the first driving voltage line 172a (refer to FIGS. 2 and 4), the display device with high resolution may be manufactured without the reduction of the area of the pixel electrode 191, and the reflectance is not increased.

As the first passivation layer 181 (FIGS. 4 to 6) including the organic material is positioned between the second channel 30b and the external light blocking member 70, the change of the characteristics of the second channel 30b may be minimized by the external light blocking member 70. That is, the driving voltage ELVDD of a predetermined magnitude must be transmitted to the external light blocking member 70 connected to the first driving voltage line 172a, however the characteristics of the second transistor TB including the second channel 30b may be changed when an unintended voltage change is generated. To prevent this, the first passivation layer 181 interposed between the second channel 30b (refer to FIG. 10) and the external light blocking member 70 may include the organic material. The organic material may minimize the characteristic change of the transistor by the voltage change.

In the illustrated exemplary embodiment, the external light blocking member 70 connected to the first driving voltage line 172a overlaps the second channel 30b, however it is not limited thereto, and the external light blocking member 70 may be various wiring applying a direct-current ("DC") voltage. In an exemplary embodiment, the external light blocking member 70 may include wiring connected to the initialization voltage line 156 transmitting the initialization voltage Vint as the DC voltage, for example.

A second passivation layer 182 (refer to FIGS. 4 to 6) may be positioned on the second data metal line (172a, 70, and 74) and the first passivation layer 181. In an exemplary embodiment, the second passivation layer 182 may include an organic material such as a polyacryl-based resin, a polyimide-based resin, or a deposition layer of the organic material and an inorganic material.

The second passivation layer 182 covers the second data metal line (172a, 70, and 74) to be flat such that the pixel electrode 191 may be disposed on the second passivation layer 182 without a step. A contact hole 83 (refer to FIGS. 3 and 6) may be defined in the second passivation layer 182.

The pixel electrode 191 as the first electrode may be positioned on the second passivation layer 182. A sixth connecting member 74 may be connected to the pixel electrode 191 through a contact hole 83 defined in the second passivation layer 182.

A pixel definition layer ("PDL") 350 (refer to FIGS. 4 to 6) covering the second passivation layer 182 and the edge of the pixel electrode 191 may be positioned thereon, and a pixel opening 351 (refer to FIG. 6) exposing the pixel electrode 191 is defined in the PDL 350. In an exemplary embodiment, the PDL 350 may include the organic material such as a polyacrylate resin and a polyimide resin, or of silica-series inorganic materials.

An organic emission layer 370 (refer to FIG. 6) as a light emission member is disposed on the pixel electrode 191 exposed by the pixel opening 351, and a common electrode 270 (refer to FIGS. 4 to 6) as a second electrode is disposed on the organic emission layer 370. The common electrode 270 is also disposed on the PDL 350, thereby being provided throughout the plurality of pixels PX. As such, the OLED including the pixel electrode 191, the organic emission layer 370, and the common electrode 270 is disposed.

Herein, the pixel electrode 191 is an anode which is a hole injection electrode, and the common electrode 270 is a cathode which is an electron injection electrode, for example. However, the exemplary embodiment according to the invention is not necessarily limited thereto, and the pixel electrode 191 may be the cathode and the common electrode 270 may be the anode according to a driving method of the display device, for example. Holes and electrons are injected into the organic emission layer 370 from the pixel electrode 191 and the common electrode 270, respectively, and excitons acquired by combining the injected holes and electrons fall from an excitation state to a ground state.

In an exemplary embodiment, the organic emission layer 370 includes a low-molecular organic material or a high-molecular organic material such as poly(3,4-ethylenedioxythiophene) ("PEDOT"), for example. Further, in an exemplary embodiment, the organic emission layer 370 may be provided with multiple layers including an emission layer and at least one of a hole injection layer ("HIL"), a hole transporting layer ("HTL"), an electron transporting layer ("ETL"), and an electron injection layer ("EIL"). When the organic emission layer 370 includes all of the layers, the hole injection layer is disposed on the pixel electrode 191 which is the positive electrode, and the hole transporting layer, the light emission layer, the electron transporting layer, and the electron injection layer are sequentially laminated thereon.

An encapsulation member (not shown) protecting the OLED may be disposed on the common electrode 270, and the encapsulation member may be sealed to the substrate 110 by a sealant and may include various materials such as glass, quartz, ceramic, plastic, and metal. A thin film encapsulation layer may be disposed on the common electrode 270 by depositing the inorganic layer and the organic layer without the usage of the sealant.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
   a substrate:
   a first transistor which is disposed on the substrate and includes:
      a first channel disposed on the substrate and including a polycrystalline semiconductor member;
      a first source electrode and a first drain electrode disposed at respective opposite sides of the first channel;
      a first gate electrode overlapping the first channel; and
      a first insulating layer covering the first gate electrode,
   a second transistor which is disposed on the substrate, is separated from the first transistor and includes:
      a second gate electrode disposed on the first insulating layer;
      a second channel disposed on the second gate electrode and including an oxide semiconductor member;
      a second source electrode and a second drain electrode disposed on the second channel; and
      an external light blocking member disposed on the second source electrode and the second drain electrode and overlapping the second channel,
   a first electrode connected to one of the first transistor and the second transistor;
   a second electrode facing the first electrode; and
   a light emission member disposed between the first electrode and the second electrode.

2. The display device of claim 1, further comprising a driving voltage line which transmits a driving voltage to the light emission member,
   wherein the driving voltage line includes a first driving voltage line extending in a first direction and a second driving voltage line extending in a second direction crossing the first direction, and
   the external light blocking member is disposed in the same layer as the first driving voltage line.

3. The display device of claim 2, wherein the external light blocking member is connected to the first driving voltage line.

4. The display device of claim 2, further comprising:
   a first scan line which is disposed on the substrate and transmits a first scan signal;
   a second scan line which is disposed on the substrate and transmits a second scan signal which is inverse to the first scan signal; and
   a data line which crosses the first scan line and the second scan line and transmits a data voltage,
   the first transistor further includes:
      a switching transistor connected to the first scan line and the data line, and
      a driving transistor connected to the switching transistor,
   the second transistor further includes:
      a compensation transistor which is turned on by the second scan signal and compensates a threshold voltage of the driving transistor,
      the compensation transistor includes a first oxide semiconductor member overlapping the second scan line,
   the second channel includes a compensation channel disposed in the first oxide semiconductor member, and
   the compensation channel overlaps the external light blocking member in a plan view.

5. The display device of claim 4, further comprising a third scan line which extends parallel to the first scan line and transmits a third scan signal, and
   an initialization voltage line which transmits an initialization voltage initializing the driving transistor,
   the second transistor further includes an initialization transistor which is turned on depending on the third scan signal and transmits the initialization voltage to a driving gate electrode of the driving transistor,
   the initialization transistor includes a second oxide semiconductor member overlapping the third scan line,
   the second channel further includes an initialization channel disposed in the second oxide semiconductor member, and
   the initialization channel overlaps the external light blocking member.

6. The display device of claim 5, further comprising a bypass control line which transmits a bypass control signal,
   the second transistor further includes a bypass transistor which is turned on depending on the bypass control signal and bypasses a part of a driving current transmitted by the driving transistor,
   the bypass transistor includes a third oxide semiconductor member overlapping the bypass control line,
   the second channel further includes a bypass channel disposed in the third oxide semiconductor member, and
   the bypass channel overlaps the external light blocking member.

7. The display device of claim 6, wherein the data line and the first driving voltage line are disposed in different layers from each other.

8. The display device of claim 6, wherein
the first scan line and the initialization voltage line are disposed in the same layer as each other, and
the second scan line, the third scan line, and the bypass control line are disposed in the same layer as each other.

9. The display device of claim 6, wherein
the compensation channel, the initialization channel, and the bypass channel are separated from each other.

10. The display device of claim 6, wherein
the second gate electrode includes a compensation gate electrode which is a part of the second scan line and overlaps the compensation channel, an initialization gate electrode which is a part of the initialization voltage line and overlaps the initialization channel, and a bypass gate electrode which is a part of the bypass control line and overlaps the bypass channel.

11. The display device of claim 1, further comprising
a second insulating layer between the second source electrode and the second drain electrode, and the external light blocking member,
wherein the second insulating layer includes an organic material.

12. The display device of claim 10, wherein
the second source electrode includes
a compensation source electrode disposed in the same layer as the data line and partially overlapping the first oxide semiconductor member,
an initialization source electrode disposed in the same layer as the data line and partially overlapping the second oxide semiconductor member, and
a bypass source electrode disposed in the same layer as the data line and partially overlapping the third oxide semiconductor member.

13. The display device of claim 12, wherein
the second drain electrode includes
a compensation drain electrode disposed in the same layer as the data line and partially overlapping the first oxide semiconductor member,
an initialization drain electrode disposed in the same layer as the data line and partially overlapping the second oxide semiconductor member, and
a bypass drain electrode disposed in the same layer as the data line and partially overlapping the third oxide semiconductor member.

14. The display device of claim 13, further comprising
a driving gate electrode overlapping the second driving voltage line, and
a first connecting member disposed in the same layer as the data line and connected to the driving gate electrode, and
the first connecting member includes the compensation drain electrode and the initialization source electrode.

15. The display device of claim 14, further comprising
a second connecting member disposed in the same layer as the data line and connected to a part of the first channel, and
the second connecting member includes the compensation source electrode.

16. The display device of claim 15, further comprising
a third connecting member disposed in the same layer as the data line and connected to the initialization voltage line, and
the third connecting member includes the initialization source electrode and the bypass drain electrode.

17. The display device of claim 16, further comprising
a fourth connecting member disposed in the same layer as the data line and connected to a part of the first channel, and
the fourth connecting member includes the bypass source electrode.

18. The display device of claim 17, further comprising
a fifth connecting member disposed in the same layer as the data line and connected to the second driving voltage line.

19. The display device of claim 18, further comprising
a sixth connecting member disposed in the same layer as the first driving voltage line and connected to the fourth connecting member.

20. The display device of claim 6, wherein:
the external light blocking member includes a first boundary line and a second boundary line, and
a plane first interval of the first boundary line and the second channel in a width direction is larger than a plane second interval of the second boundary line and the second channel in a length direction.

21. A display device comprising:
a substrate;
a first scan line which is disposed on the substrate and transmits a first scan signal;
a data line which crosses the first scan line and transmits a data voltage;
a first transistor including a polycrystalline semiconductor member and a second transistor including an oxide semiconductor member, wherein the first and second transistors are disposed on the substrate and separated from each other;
a first electrode connected to one of the first transistor and the second transistor;
a second electrode facing the first electrode;
a light emission member disposed between the first electrode and the second electrode; and
a driving voltage line which transmits a driving voltage to the light emission member,
wherein the driving voltage line is disposed on a different layer from the data line,
an external light blocking member extending from the driving voltage line overlaps the oxide semiconductor member and is disposed on the oxide semiconductor member, and
the external light blocking member is disposed below the light emission member.

* * * * *